United States Patent [19]

Monahan

[11] 3,892,180

[45] July 1, 1975

[54] LIGHT ACTIVATING IMAGING PROCESS

[75] Inventor: Alan R. Monahan, East Rochester, N.Y.

[73] Assignee: Xerox Corporation, Stamford, Conn.

[22] Filed: May 29, 1974

[21] Appl. No.: 474,271

Related U.S. Application Data

[62] Division of Ser. No. 245,276, April 18, 1972, Pat. No. 3,834,906.

[52] U.S. Cl. ................ 101/456; 101/457; 101/460; 101/462; 101/467; 101/470; 96/33; 96/86 P; 96/35.1

[51] Int. Cl. ............................................ G03f 7/02

[58] Field of Search........ 96/33, 27 R, 67, 79, 87 R, 96/115 R, 35.1, 86 P; 204/162 SA; 101/456, 457, 460, 462, 467, 470

[56] References Cited

UNITED STATES PATENTS

| | | | |
|---|---|---|---|
| 2,811,510 | 10/1957 | Leubner | 96/115 |
| 2,870,011 | 1/1959 | Robertson | 96/115 |
| 2,908,667 | 10/1959 | Williams | 96/115 |
| 3,022,172 | 2/1962 | Ohba et al. | 96/114 |

*Primary Examiner*—Norman G. Torchin
*Assistant Examiner*—Edward C. Kimlin

[57] ABSTRACT

There is disclosed an imaging system whereby alkyl esters of polyvinylaryl sulfonic acids are selectively insolubilized upon exposure to actinic radiation.

8 Claims, No Drawings

LIGHT ACTIVATING IMAGING PROCESS

This is a division of application Ser. No. 245,276, filed Apr. 18, 1972, now U.S. Pat. No. 3834906.

BACKGROUND OF THE INVENTION

This invention relates to an imaging system and more specifically to a light activating imaging process. The invention is a continuation-in-part of copending application Ser. No. 816,104, filed in the United States Patent Office on April 14, 1969.

It is known to sensitize layers of materials such as albumen, gelatin and other colloids by the incorporation of various additives such as ammonium bichromate. Upon exposing these materials photographically, the exposed areas become insoluble whereas the non-exposed areas remain soluble and can be washed away. A difficulty in utilizing these systems is that with these materials sensitized with the bichromate, for example, it is necessary to perform sensitization just prior to the exposure inasmuch as the sensitized material has a very short shelf life. Therefore, it would be desirable to find a process which employs a light sensitive material which may be stored for considerable periods of time until it is desirable to image the material such as by exposure to actinic radiation.

SUMMARY OF THE INVENTION

It is, therefore, an object of this invention to provide an imaging system which will overcome the above noted disadvantages.

It is a further object of this invention to provide an imaging system utilizing substantially stable materials.

Still a further object of this invention is to provide an imaging process readily adapted to the preparation of various types of printing plates.

Yet, still a further object of this invention is to provide a novel master making process.

Another object of this invention is to provide an imaging process capable of being adapted to a projection imaging system.

BRIEF DESCRIPTION OF INVENTION

The foregoing objects and others are accomplished in accordance with the present invention, generally speaking by providing a class of materials, the alkyl esters of polyvinylaryl sulfonic acids, which have been generally found to be light sensitive, photoinsoluble materials satisfying the general formula:

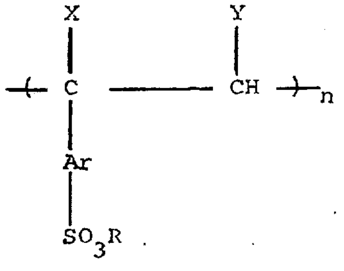

wherein R may be any straight or branched chain alkyl group including halogen substituted groups up to and including ten carbon atoms, e.g., $CH_3$, $C_2H_5$, $C_3H_7$, $C_2H_4Cl$, $C_3H_5F_2$, etc.;

wherein n is an integer having a value of from 10 $-<\infty$;

X and/or Y are hydrogen, halogen, alkyl or halogen substituted alkyl groups, e.g., H, $CH_3$, Cl, $C_2H_4F$, etc.;

wherein Ar may be any polynuclear aromatic fused ring hydrocarbon up to and including 5 benzene rings, e.g., perylene, pyrene, benzanthracene, tetracene, pentacene, etc., the preferred of which are phenyl, naphthyl or anthryl.

upon exposure selectively to an electromagnetic radiation source, the polymeric material becomes selectively insoluble in the exposed areas. The unexposed areas are removed from the substrate upon which the polymeric material is coated by washing with any number of the conventional organic solvents available, such as acetone, yielding an insoluble polymeric image. Depending upon the nature of the resulting image and the substrate upon which the material is initially coated, the resulting imaged member may be utilized, as is, to display the desired image or may be used in conjunction with any number of printing systems, such as relief printing and lithographic printing, to produce a multitude of copies of the original. Alternatively, the degree of exposure of the polymeric material may be so controlled so as to produce a translucent image which may be used in a projection imaging system whereby the translucent image scatters light transmitted through and by the coated polymer. In the latter system, the organic solvent application step is eliminated.

DETAILED DESCRIPTION OF THE INVENTION

The polymeric materials utilized in conjunction with the present invention may be prepared from materials similar to the monomeric alkyl styrene sulfonates disclosed in U.S. Pat. No. 2,616,917. The sulfonate polymer which is prepared according to conventional polymerization techniques, such as disclosed in the above identified patent is coated on any suitable substrate, such as glass, paper or metal depending upon the intended use of the resulting imaged member. Exposure of the member is made to any suitable electromagnetic radiation source, such as xenon flash lamp, with the time for exposure depending upon the intensity of the exposure. The resulting exposed member is subjected to a solvent which selectively removes the unexposed portions of the polymer from the underlying substrate.

The resulting imaged member may be used in its exposed state as the final reproduction of the original document in which instance it might be desirable to increase the density contrast of the image. This may be accomplished by any desirable technique, such as dying the image by dipping the imaged member into a suitable dye or, depending upon the specific properties of the polymer, heating so as to discolor the remaining polymer on the substrate. In the alternative a dye may be included in the polymer in the as-coated condition where upon dissolving away the unexposed polymer there is instantly produced a visible image of the original. In addition, the imaging process of the present invention also lends itself to the preparation of various sundry printing masters depending upon the thickness of the layer coated upon the substrate, the properties of the substrate utilized and the other various requirement of the particular printing system to which it may be adapted as further discussed below.

The essential feature of the polymer utilized in conjunction with the present invention is the presence of the radical $—SO_3R$ which may be substituted onto any suitable aromatic nucleus such as a phenyl group, a naphthalene group or an anthracene group. The number of sulfonate groups on the aromatic nucleus or the relative location and/or position of the group is not considered critical. Furthermore, the aromatic group may be attached to or can be a part of any suitable film-forming polymeric backbone, for example:

(1)
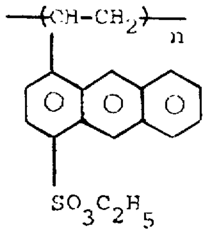

the ethyl ester of poly (8-vinyl anthracene-5-sulfonic acid)

(2)
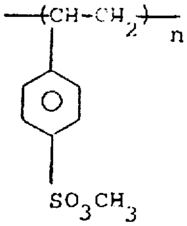

the methyl ester of poly (1-vinyl benzene-4-sulfonic acid)

(3)
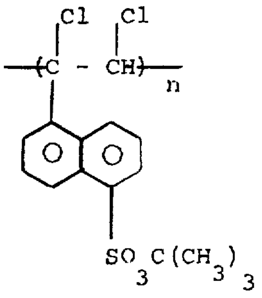

the tertiary butyl ester of poly (α,β-dichloro vinyl-1-naphthalene-5-sulfonic acid)

(4)
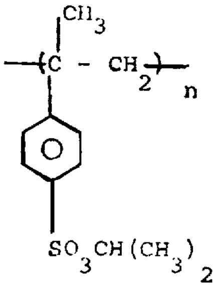

the isopropyl ester of poly (α-methyl vinyl-1-benzene-4-sulfonic acid)

(5)
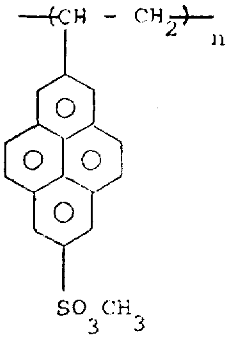

the methyl ester of poly (4-vinyl pyrene-9-sulfonic acid)

Other typical sulfonate polymers include the ethyl ester of poly(1-vinylbenzene-4-sulfonic acid, methyl ester of poly(α-methyl vinyl-1-benzene-4-sulfonic acid), ethyl ester of poly(4-vinyl pyrene-9-sulfonic acid, methyl ester of poly(α,β-dimethyl vinyl-1-naphthalene-5-sulfonic acid), tertiary butyl ester of poly(α-chloro vinyl-1-benzene-4-sulfonic acid).

The sulfonate polymers of the present invention may comprise homopolymers or the sulfonate monomers may be copolymerized with one another or with one or more other polymerizable unsaturated organic compounds containing the basic vinyl group $CH_2$=CH—to high molecular weight resins. As indicated by the examples, the vinyl group may be a substituted or unsubstituted derivative of the following structural formula:

wherein X and/or Y are hydrogen, halogen, straight or branched alkyl hydrocarbon groups up to and including eight carbon atoms or halogen substituted alkyl moieties up to and including eight carbon atoms. Typical such copolymerizable monomers include vinyl esters of carboxylic acids, e.g., vinyl acetate, vinyl stearate, vinyl benzoate; vinyl alkyl ketones, e.g., methyl vinyl ketone, ethyl vinyl ketone; vinyl alkyl ethers, e.g., methyl vinyl ether, ethyl vinyl ether; vinyl halides, e.g., vinyl chloride, vinyl bromide; vinyl urethanes, e.g., vinyl methyl urethane, vinyl ethyl urethane; styrenes; ethylene;

nate monomer comprise at least about 10 percent of the poly utilized.

Any suitable actinic radiation source may be used in the course of the present invention which will produce the desired effect. The light source should preferably, although not necessarily, furnish an effective amount of ultraviolet radiation. Typical sources of actinic radiation used in conjunction with exposure systems include xenon flash lamps, carbon arcs, fluorescent lamps, argon glow lamps, photographic flood lamps, tungsten lamps, and mercury vapor lamps with the length of exposure generally depending upon the particular exposure means utilized. For example, if a high intensity xenon flash lamp is utilized, then the length of exposure will amount to a fraction of a second whereas in the case of a mercury arc lamp the exposure time might range up to periods of minutes.

The solvent liquid used for washing or "developing" the exposed member should be selected with care such that it has good solvent action on the unexposed areas, yet have little action on the exposed areas. Typical organic solvents include acetone, chloroform, toluene, chlorobenzene, trichloroethylene, methyl ethyl ketone, methanol, ethanol, isopropanol, tetrachloroethylene and benzene.

The film of the polymer may be coated on the surface of the support substrate at generally any thickness depending on the specific utility of the imaged member, and this will usually fall within a range of from about 0.1 to about 750 microns. For example, if it is desirable to prepare a relief printing master then the thickness of the polymer should be coated to about 25 to 750 microns, whereas if the resulting imaged member is to be used in a letter set printing process then the coating will generally range from about 12 to about 125 microns. In the instance, where the resulting printing member would be used in a lithographic printing system then the coating will be applied to a thickness of from about 1 to about 200 microns. The polymer film generally fixes itself to the underlying substrate by air drying.

When the imaged member is to be used in a lithographic printing mode the substrate will generally be such that it is hydrophilic in nature and, upon removal of the unexposed areas of the polymer, provide immediately the necessary surface-property differential required between the background and the image or hydrophobic polymer remaining on the surface. Any suitable substrate having these required properties may be used. Typical hydrophilic materials include copper, glass, steel, brass, aluminum, nickel and zinc. Of course, any material may be utilized having hydrophobic properties in which instance, however, the background area would have to be converted, as is conventionally done lithographic printing, by the application of a conversion solution so as to exhibit hydrophilic properties. Typical hydrophobic substrates would include polyethlene terephthalate, polytetrafluoroethlene, polyethylene, polyvinylchloride, polystyrene and polyvinylfluoride. When used in conjunction with a lithographic printing system the image may be transferred directly upon inking to the final receiver sheet, but more suitably, as is conventionally practiced, the inked image will be transferred initially to an offset blanket and subsequently to the final receiving sheet.

When the process of the present invention is utilized in the preparation of a relief printing member then following exposure and removal of the unexposed areas with the proper solvent the member is ready for use in a relief or letterpress printing system. Conventional relief printing inks may be applied to the member inking the polymer which is in turn contacted with a copy sheet to which the final image is to be transferred. The process may be repeated as many number of times as required. Letter set printing, on the other hand, like conventional offset or lithographic printing, uses a blanket for transferring the image from the plate to paper or the desired receiving substrate. Unlike offset, however, it uses a "relief" type plate and requires no dampening system thereby eliminating the use of water. As with relief or letterpress printing, inking in the letter set mode is from a raised image and is often referred to as indirect letter-press. Similar base materials as discussed above may be used with these relief systems. However, in these printing processes the surface property of the substrate material is not significant.

The utilization of the photoinsoluble property of the polymers of the present invention may be also adapted to a gravure imaging system in which instance the polymer would be coated to a thickness of about 12 to about 125 microns, with the printing being done, as is conventional with gravure printing, from the areas of recess or those areas from which the unexposed polymer has been removed. In addition to utilizing the polymer coated plate of the present invention in a manner so as to prepare a gravure printing master, it also may be used generally to prepare a uniformly porous gravure cylinder which may be adapted so as to serve as a gravure donor member.

To further define the specifics of the present invention, the following examples ae intended to illustrate and not limit the particulars of the present system. Parts and percentages are by weight unless otherwise indicated. The examples are also intended to illustrate various preferred embodiments of the present invention.

EXAMPLE I

The methyl ester of 1-vinyl benzene-4-sulfonic acid is prepared according to the procedure of Gritsai and Prib disclosed in the Journal of Organic Chemistry (USSR), 3,1597 (1967). The sulfonate monomer is bulk-polymerized thermally at a temperature of about 50°C for about 60 hours. The resulting polymer is dissolved in acetone and then precipitated with cyclohexane. This procedure is repeated several times and then the polymer is dried in a vacuum. A solution of the polymer in acetone having a concentration of about 5 grams polymer per 100 ccs. solvent is prepared and an aluminum sheet flow coated with the polymer to a thickness of about 1 micron. The coated member is air dried and exposed selectively to a single pulse of a 100 joule xenon flash lamp for a period of about 150 microseconds. The exposed member is then dipped in an acetone solvent which wasthes away the unexposed areas of the polymer to produce the imaged member.

EXAMPLE II

The ethyl ester of 1-vinyl benzene-4-sulfonic acid is prepared according to the procedure of Example I and bulkpolymerized at about 50°C for about 60 hours. The polymer is dissolved in toluene and then precipitated with cyclohexane. This process is repeated several times and then the polymer dried in a vacuum. The polymer is then placed in solution by dissolving about propylene; isobutylene; butadienes; alpha-methacrylonitrile, vinylidene dichloride, vinylidene chloride-fluoride, methacrylic acid and its anhydride, alkyl esters of maleic and fumaric acids such as, methyl maleate, methyl fumarate and the like.

It is desirable, although not critical, that the sulfo- 17 grams of the polymer per 100 ccs. of toluene. The resulting polymer solution is coated on the surface of a glass substrate to a thickness of about 5 microns. The coated member is air dried and then exposed selectively for a period of about 2 minutes to a low pressure mercury arc lamp. The resulting exposed plate is dipped in acetone to remove the unexposed portions of the polymer and produce the relief image.

EXAMPLE III

The tertiary butyl ester of $\alpha,\beta$-dichlorovinyl-1-naphthalene-5-sulfonic acid is prepared and bulk-polymerized at a temperature of about 50°C for about 60 hours. The polymer is dissolved in acetone and then precipitated with cyclohexane. The process is repeated several times and then dried in a vacuum. A solution of the sulfonate polymer in acetone is prepared by dissolving about 50 grams of the polymer per 100 ccs. of the acetone. The resulting solution is flow-coated to a thickness of about 25 microns on the surface of an aluminum sheet. Following air drying the coated member is selectively exposed to a xenon flash lamp of the type used in Example I for a period of about 150 microseconds. The exposed member is dipped in an acetone bath to remove the unexposed portions of the polymer. The resulting relief image is contacted with an ink roller and the ink surface subsequently contacted with a paper copy sheet with an imprint of the image being transferred to the latter substrate. At least more than one reproduction of the original image is obtained.

EXAMPLE IV

The image member prepared according to Example I is wrapped about the cylinder of a lithographic printing press and operated in a conventional manner using a fountain solution composed of:

| | |
|---|---|
| Carboxymethyl cellulose | 10 ml. |
| Glycerol | 5 ml. |
| Water | 500 ml. |
| Substrate Wetting Agent F-126 (Ammonium salt of perfluorocaprylic acid available from 3M) | 5 ml. |

the Ph of which is adjusted to about 7 with sodium hydroxide. A lithographic ink is then applied to the printing surface of the imaged member and by-way of a rubber offset blanket at least more than one print is obtained.

EXAMPLE V

The methyl ester of 1-vinylbenzene-4-sulfonic acid is bulk-polymerized and prepared as discussed about in Example I, and flow-coated on the surface of a Mylar film to a thickness of about 1 micron. The coated member is selectively exposed to a low pressure mercury arc lamp for about 1 minute. This exposure visually produces a translucent area in the polymer coating on the Mylar film. The resulting imaged member is mounted in a projection apparatus and light projected through the exposed Mylar coated film with an image being visually perceptible on a projection screen. This example demonstrates the projection capabilities of the imaging system herein described.

Although the present examples were specific in terms of conditions and materials used, any of the above listed typical materials may be substituted when suitable in the above examples with similar results. In addition to the steps used in conjunction with the imaging member of the present invention other steps or modifications may be used if desirable. For example, many forms of coating may be used to apply the polymer to the surface of the support substrate. Also, if desirable, the polymer image may be developed with an electroscopic marking material or toner which, upon proper selection dictated by the triboelectric series, will adhere in any imagewise manner to the insoluble polymer. In addition, other materials may be incorporated in the polymer, the solvents or the monomer which will enhance, synergize or otherwise desirably effect the properties of these materials for their present use. For example, initiators such as, butyl lithium, may be added to the monomer during the polymerization step so as to initiate the polymerization process.

Anyone skilled in the art will have other modifications occur to him based on the teachings of the present invention. These modifications are intended to be encompassed within the scope of this invention.

What is claimed is:

1. A printing member comprising a support substrate having fixed to the surface thereof in imagewise configuration photoinsoluble alkyl esters of polyvinylaryl sulfonic acids, said esters satisfying the formula:

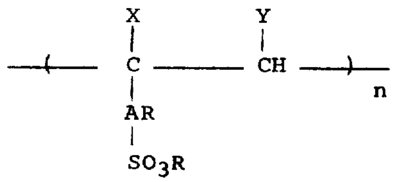

wherein R may be any straight or branced chain alkyl group including halogen substituted groups up to and including ten carbon atoms;

wherein n is an integer having a value of from 10 to infinity;

X and/or Y are hydrogen, halogen, alkyl or halogen substituted alkyl groups;

wherein Ar may be any polynuclear aromatic fused ring hydrocarbon up to an including 5 benzene rings.

2. The printing member as disclosed in claim 1 wherein said alkyl esters of polyvinylaryl sulfonic acids are selected from at least one member of the group consisting of the methyl ester of poly(1-vinylbenzene-4-sulfonic acid) and the ethyl ester of poly(1-vinylbenzene-4-sulfonic acid).

3. A method of printing from a contact printing member which comprises:

a. coating the surface of a support substrate with alkyl esters of polyvinylaryl sulfonic acids;

b. selectively exposing said composition to actinic radiation;

c. developing said exposed polymer by dissolving away the unexposed portions of said polymer;

d. applying to the imaged surface of said member a printing ink; and e. contacting said inked image with a receiver sheet.

4. The method as disclosed in claim 3 wherein said inking and printing steps are repeated at least once.

5. The method as disclosed in claim 3 wherein said alkyl esters of polyvinylaryl sulfonic acids are selected from at least one member of the group consisting of the methyl ester of poly(1-vinylbenzene-4-sulfonic acid) and the ethyl ester of poly(1-vinylbenzene-4-sulfonic acid).

6. A method of making multiple copies from a contact printing member which comprises:

a. coating the surface of a support substrate with a layer of alkyl esters of polyvinylaryl sulfonic acids;
b. selectively exposing said polymer to actinic radiation so as to insolubilize said exposed areas;
c. developing said exposed member with a solvent which will remove the unexposed portions of said polymer from said member;
d. applying a fountain solution to the surface of said imaged member;
e. applying a lithographic ink to the surface of said wetted member; and
f. contacting said inked member with the surface of a transfer sheet by way of an offset blanket.

7. The method as disclosed in claim 6 wherein said inking and transfer steps are repeated at least once.

8. The method as disclosed in claim 6 wherein said alkyl esters of polyvinylaryl sulfonic acids are selected from at least one member of the group consisting of the methyl ester of poly(1-vinylbenzene-4-sulfonic acid) and the ethyl ester of poly(1-vinylbenzene-4-sulfonic acid).

* * * * *